(12) United States Patent
Lee

(10) Patent No.: US 6,310,774 B1
(45) Date of Patent: Oct. 30, 2001

(54) HEAT SINK CLIP

(75) Inventor: Hsieh Kun Lee, Chung-Ho (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/695,487

(22) Filed: Oct. 23, 2000

(51) Int. Cl.⁷ .................................................. H05K 7/20
(52) U.S. Cl. .......................... 361/704; 24/458; 165/185; 248/510; 257/727
(58) Field of Search .............................. 24/453, 457, 458, 24/473, 570, 573.1, 625; 165/80.3, 185; 174/16.3; 257/717–719, 722, 727; 248/316.7, 500, 505, 510; 361/687, 703, 704, 722, 709–711, 717–719; 439/485, 487; 267/150, 158, 160

(56) References Cited

U.S. PATENT DOCUMENTS 5,771,960 * 6/1998 Lin ...................................... 165/80.3
5,791,403 * 8/1998 Chiou ................................. 165/80.3
6,111,752 * 8/2000 Huang et al. .
6,208,518 * 3/2001 Lee ...................................... 361/704
6,226,186 * 5/2001 Chien ................................. 361/704

* cited by examiner

Primary Examiner—Gerald Tolin
(74) Attorney, Agent, or Firm—Wei Te Chung

(57) ABSTRACT

A heat sink clip (50) includes a body (20) and an R-shaped handle (40). The body includes a central pressing portion (29), and first and second spring portions (21, 24) extending from opposite ends of the pressing portion. First and second legs (22, 27) depend from free ends of the first and second spring portions respectively. A catch (25) is stamped upwardly from the second spring portion, and then bent toward the pressing portion. A bent tab (31) is stamped outwardly from the second leg and then bent downwardly. The handle includes first and second connecting portions (41, 42), and anactuating portion (43) between the first and second portions. First and second fixing holes (44, 45) are respectively defined near the free ends of the first and second portions, and respectively engage with the catch and bent tab of the body.

12 Claims, 3 Drawing Sheets

HEAT SINK CLIP

BACKGROUND OF THE INVENTION

1. Field of the Invention

The present invention relates to a clip, and particularly to a clip for a heat sink which readily attaches the heat sink to an electronic device.

2. The Related Art

During operation of an electronic device in a computer system, a large amount of heat may be produced. Such heat must be quickly removed from the electronic device to prevent the computer system from becoming unstable or being damaged. Consequently, a heat sink is frequently attached to the electronic device to remove heat therefrom, and a clip is used to secure the heat sink to the electronic device.

Referring to FIG. 3, a conventional clip 1 comprises a pressing body 2 and two arms 3 extending downwardly from opposite ends of the pressing body 2. Each arm defines two apertures 4, 5 arranged one above the other. The lower apertures receive corresponding tabs (not shown) formed on a socket (not shown) on which a CPU (not shown) is mounted, for attaching a heat sink to the CPU. The upper apertures 5 are designed to engage with a tool such as a screwdriver. The tool is used for engaging the lower apertures 4 with the tabs, and for disengaging the lower apertures 4. However, it is inconvenient to have to use a tool, especially within the limited confines of a computer case.

SUMMARY OF THE INVENTION

Accordingly, an object of the present invention is to provide a clip for readily assembling a heat sink to an electronic device, and for readily disassembling the heat sink therefrom.

To achieve the above-mentioned objects, a heat sink clip comprises a body and an R-shaped handle. The body comprises a pressing portion, and first and second spring portions extending from opposite ends of the pressing portion. First and second legs respectively depend from free ends of the first and second spring portions. A catch is stamped upwardly from the second spring portion and then bent toward the pressing portion. A bent tab is stamped outwardly from the second leg and then bent downwardly. The handle comprises first and second connecting portions, and an actuating portion between the first and second portions. First and second fixing holes are respectively defined near the free ends of the first and second portions, and respectively engage with the catch and bent tab of the body.

Other objects, advantages and novel features of the present invention will be drawn from the following detailed embodiment of the present invention with attached drawings, in which:

DESCRIPTION OF THE PREFERRED EMBODIMENT

Figure 1:
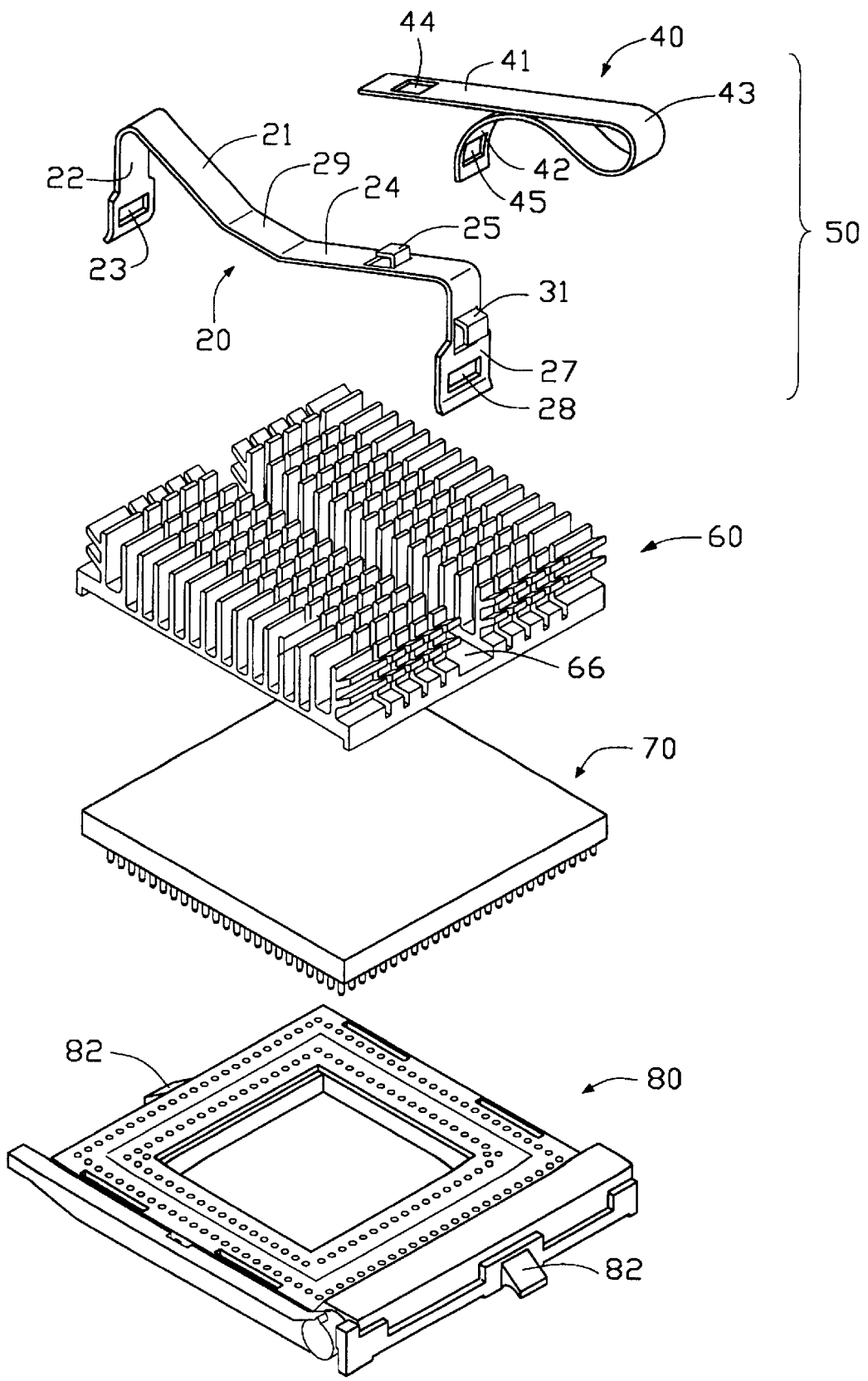
FIG. 1 is an exploded view showing a clip in accordance with the present invention, for attaching a heat sink to a CPU mounted on a socket connector.

Referring to FIG. 1, a clip 50 of the present invention attaches a heat sink 60 to a CPU 70 which is mounted on a socket connector 80. The heat sink 60, the CPU 70 and the socket connector 80 are all conventional. The heat sink 60 includes a slot 66 defined through a middle portion thereof, for receiving the clip 50. The socket connector 80 includes a pair of external tabs 82 formed on respective opposite sides thereof, for engaging with the clip 50.

The clip 50 includes a body 20 and a handle 40. The body 20 comprises a central pressing portion 29, and first and second spring portions 21, 24 extending outwardly from respective opposite ends of the pressing portion 29. First and second legs 22, 27 depend from free ends of the first and second spring portions 21, 24 respectively. A catch 25 is stamped upwardly from the second spring portion 24, and then bent horizontally toward the pressing portion 29. The first and second legs 22, 27 respectively define first and second apertures 23, 28 therein. A bent tab 31 is stamped outwardly from the second leg 27 above the second aperture 28, and then bent downwardly.

The handle 40 is generally R-shaped. The handle 40 includes a horizontal first connecting portions 41, a generally arcuate second connecting portion 42, and a generally U-shaped actuating portion 43 between the first and second connecting portions 41, 42. Opposite extremities of the actuating portion 43 abut against each other. The second connecting portion 42 is generally horizontal at its upper extremity and generally vertical at its lower extremity. First and second fixing holes 44, 45 are respectively defined in the first and second portions 41, 42, near their respective free ends.

Figure 2:
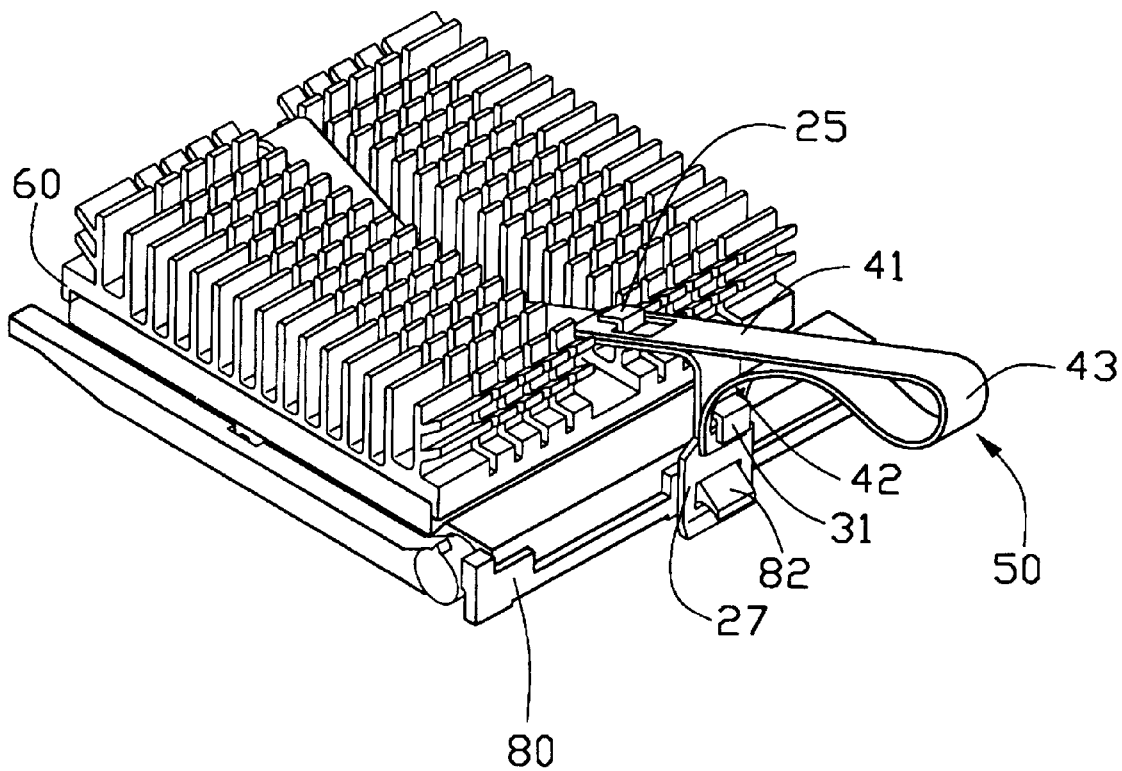
FIG. 2 is an assembled view of FIG. 1.
Figure 3:
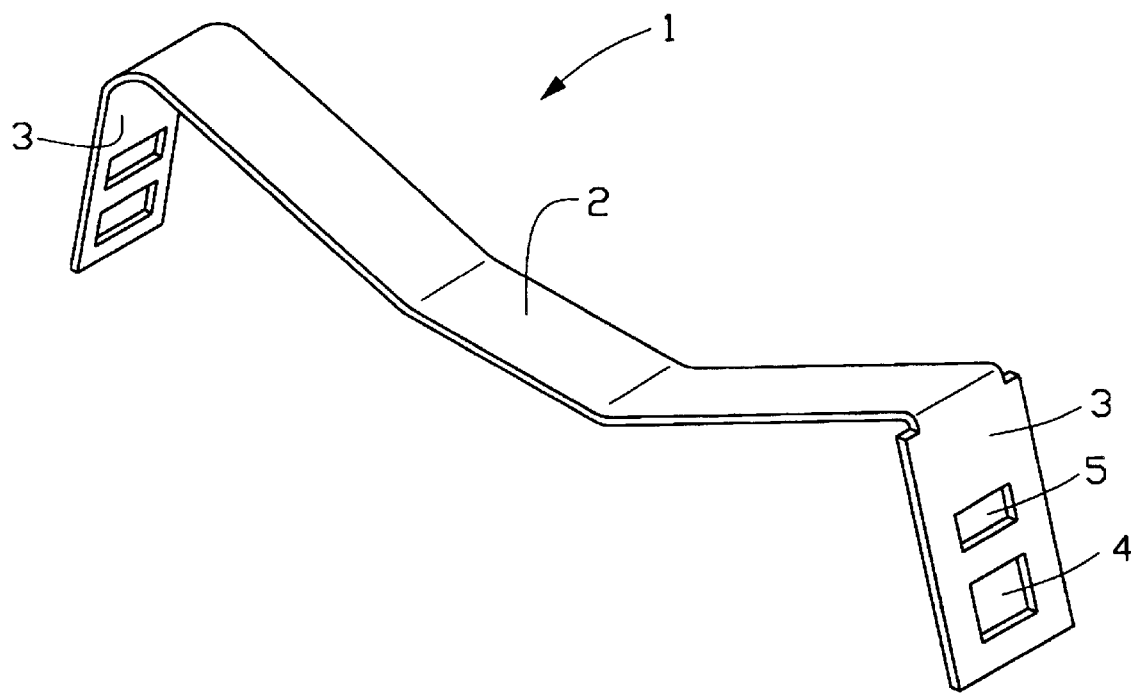
FIG. 3 is a perspective view of a conventional heat sink clip.

Referring also to FIG. 2, in pre-assembly, the handle 40 is attached to the body 20. The handle 40 is bent slightly, so that the first and second fixing holes 44, 45 of the handle 40 respectively engage with the catch 25 and the bent tab 31 of the body 20. The handle 40 remains slightly bent, thereby retaining elastic potential energy. Thus the handle 40 remains resiliently and firmly attached to the body 20.

In assembly, the heat sink 60 is placed onto a top surface of a CPU 70 which is mounted on a socket 80. The clip 50 is placed in the slot 66 of the heat sink 60. The first aperture 23 of the body 20 engages with the corresponding tab 82 of the socket connector 80. Then the handle 40 is pushed downwardly to make the second aperture 28 of the body 20 engages with the other tab 82 of the socket connector 80. Thus, the clip 50 easily attaches the heat sink 60 to the CPU 70.

The clip 50 of the present invention provides appropriate spring force for firmly retaining the heat sink 60 to the CPU 70. Furthermore, the handle 40 of the clip 50 provides a convenient and labor-saving means of assembly and disassembly.

It is noted that the invention keeps the original clip body design to have the clip body tightly and efficiently retain the heat sink on the CPU while further provides an easy installation and operation handle which is made from a separate piece to the clip body, and will not jeopardize the original strength or retention function of the clip body.

It is understood that the invention may be embodied in other forms without departing from the spirit thereof. Thus, the present example and embodiment are to be considered in all respects illustrative and not restrictive, and the invention is not to be limited to the details given herein.

What is claimed is:

1. A heat sink clip comprising:
   a body comprising a pressing portion, first and second spring portions extending from respective opposite ends of the pressing portion, and first and second legs depending from free ends of the first and second spring portions respectively, a catch being formed at the second spring portion and a bent tab being formed at the second leg, the first and second legs being adapted to engage with a corresponding socket; and a handle comprising first and second connecting portions releasably connected to the catch and the bent tab of the body respectively, and an actuating portion between the first and second connecting portions, the actuating portion being adapted to facilitate engagement of the body with the socket.

2. The heat sink clip as described in claim 1, wherein the handle is generally R-shaped.

3. The heat sink clip as described in claim 1, wherein the actuating portion of the handle is generally U-shaped, and opposite extremities of the actuating portion abuts against each other.

4. The heat sink clip as described in claim 3, wherein the first connecting portion of the handle is flat, and the second connecting portion of the handle is generally arcuate.

5. The heat sink clip as described in claim 1, wherein first and second fixing holes are defined near free ends of the first and second connecting portions of the handle respectively, the fixing holes being engageable with the catch and the bent tab of the body respectively.

6. A heat sink clip comprising:

an M-shaped body comprising a pressing portion and first and second spring portions extending from respective opposite ends of the pressing portion, and first and second legs depending from free ends of the first and second spring portions respectively, an aperture being formed in each of said first and second legs; and a handle releasably connected to the body, said handle including a first connecting portion connected to the first spring portion, a second connecting portion connected to the first leg, and an actuating portion bridging the first connecting portion and the second connecting portion and located far away from the body.

7. The heat sink clip as described in claim 6, wherein the handle is generally R-shaped.

8. The heat sink clip as described in claim 6, wherein the first spring portion defines a catch and the first leg defines a bent tab to latchably respectively engage corresponding first and second fixing holes in the first connecting portion and the second connecting portion of the handle.

9. A heat sink assembly comprising:

a socket defining a pair of locking tabs in a lengthwise direction;

a CPU positioned on the socket;

a heat sink positioned on the CPU, said heat sink defining a slot along said lengthwise direction;

a heat sink clip including a body and a handle, said body including a pressing portion and first and second spring portions extending from respective opposite ends of the pressing portion, and first and second legs depending from free ends of the first and second spring portions respectively, an aperture being formed in each of said first and second legs, said pressing portion and the first and the second spring portions being received within the slot, and the first and the second legs located on two sides of the socket with the apertures latchably engaged with the corresponding tabs; and the handle releasably connected to the body, said handle including a first connecting portion connected to the first spring portion, a second connecting portion connected to the first leg, and an actuating portion bridging the first connecting portion and the second connecting portion and located beside the socket along said lengthwise direction.

10. The assembly as described in claim 9, wherein the body is generally M-shaped.

11. The assembly as described in claim 9, wherein the handle is generally R-shaped.

12. The assembly as described in claim 9, wherein the first spring portion defines a catch and the first leg defines a bent tab to latchably respectively engage corresponding first and second fixing holes in the first connecting portion and the second connecting portion of the handle.

* * * * *